United States Patent [19]

Kim et al.

[11] Patent Number: 5,107,263

[45] Date of Patent: Apr. 21, 1992

[54] NRZ TO CMI (II) ENCODING CIRCUIT

[75] Inventors: Bong T. Kim; Kwon C. Park, both of Daejeon, Rep. of Korea

[73] Assignees: Electronics and Telecommunications Research Institute, Daejeon; Korea Telecommunication Authority, Seoul, both of Rep. of Korea

[21] Appl. No.: 626,615

[22] Filed: Dec. 7, 1990

[30] Foreign Application Priority Data

Dec. 12, 1989 [KR] Rep. of Korea ................ 1989-18401

[51] Int. Cl.$^5$ ............................................. H03M 5/14
[52] U.S. Cl. ........................................ 341/73; 341/68
[58] Field of Search ................................. 341/68, 73

[56] References Cited

U.S. PATENT DOCUMENTS

| | | | |
|---|---|---|---|
| 4,442,528 | 4/1984 | Fukuda | 341/73 |
| 4,556,868 | 12/1985 | Härle | 341/73 |
| 4,562,422 | 12/1985 | Pospischill | 341/73 |
| 4,761,635 | 6/1988 | Arnaune et al. | 341/73 |
| 4,837,782 | 6/1989 | Sasaki | 341/73 |

Primary Examiner—A. D. Pellinen
Assistant Examiner—Marc S. Hoff
Attorney, Agent, or Firm—Blakely, Sokoloff, Taylor & Zafman

[57] ABSTRACT

A NRZ/CMI (II) code converter comprising a D-type flip-flop for retiming a series of NRZ data bits received thereto with a clock synchronized therewith, an OR-gate connected to said one output of the D-type flip-flop to compose space bits of a series of said received NRZ data bits and a transmitted clock, and a delay element connected to the output of said OR-gate. The converter also comprises another OR gate connected to a negative output of said D-type flip-flop and another D-type flip-flop having a clock input connected to the output of said OR-gate. These elements function to compose mark bits of a series of the NRZ data bits with clock pulses and to generate two-divided alternative mark bits.

An exclusive OR-gate is connected to the output of said another OR-gate and the output of said another D-type flip-flop. In the exclusive OR-gate, mark bits are alternatively generated at the mark bit portions of a series of the NRZ data bits, and clock pulses are composed with a series of the NRZ data bits at the space bit portions of a series of the NRZ data bits. In addition, mark bits and space bits of a series of the NRZ data bits can be independently processed for the same time, in order to generate the CMI (II) code.

3 Claims, 2 Drawing Sheets

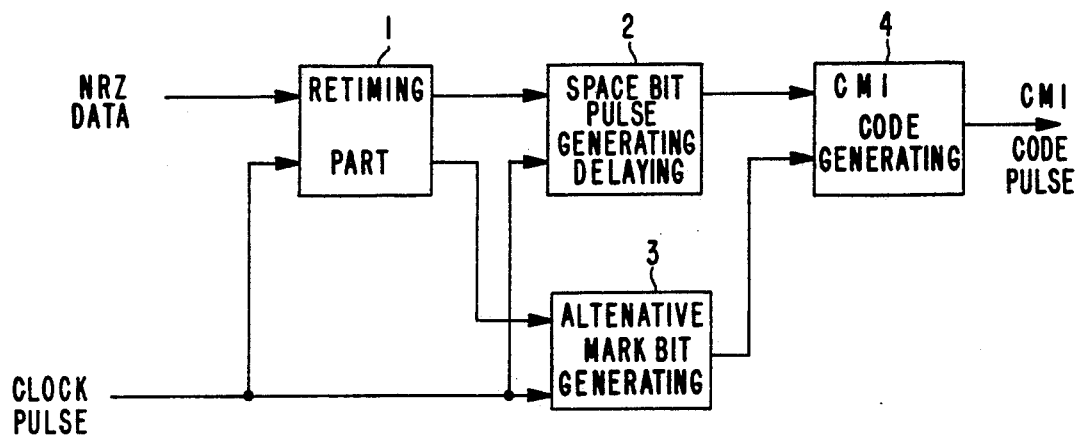
FIG. 1
FIG. 2
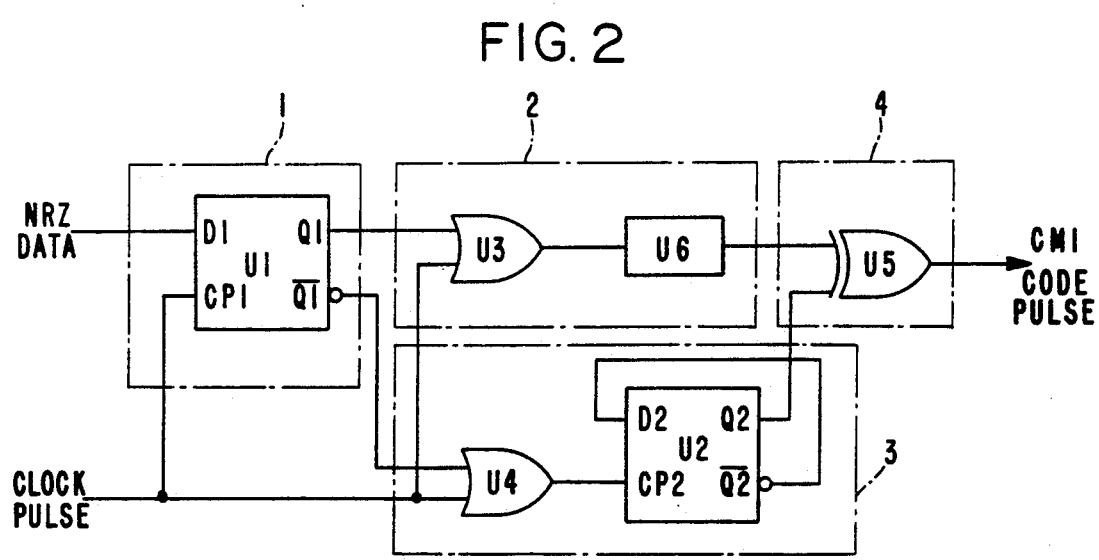

NRZ TO CMI (II) ENCODING CIRCUIT

BACKGROUND OF THE INVENTION

The present invention relates to a device for converting a series of bits of the NRZ (nonreturn to zero) type into the CMI (code mark inversion) code, more particularly to a device for converting a series of bits of the NRZ type into the CMI (Class II) code by limiting the pulse size of said CMI code to the clock pulse cycle corresponding to the NRZ data-transmitting rate.

The CMI code is widely used in optical transmission systems in which the bit-transmitting rate is about 150 Mbps. This is because encoder and decoder for the CMI code have a relatively simple constitution, because the recovery of bit clock at the receiving terminal is easily carried out, because of bit transition of a series of the CMI code data, and because any error can be monitored on line by using the characteristics of code itself without any use of additional bits. However, conventional CMI (Class II) (hereinafter, referred to a CMI (II)) encoders have a complex constitution, as compared with the CMI (I) encoder. In addition, it is difficult to maintain an accurate duty cycle of the CMI code pulse. As a result, it is very difficult to practically use the system utilizing the CMI (II) code, in spite of several advantages obtained therefrom.

SUMMARY OF THE INVENTION

Therefore, an object of the present invention is to eliminate the above-mentioned disadvantages encountered in the prior art and the provide a NRZ/CMI (II) code converter which enables to maximally restrict any possible timing glitch of the CMI (II) code pulses occuring during the conversion of a series of NRZ data bits in the CMI (II) code pulses and to accurately maintain the duty cycle, by using simple logic elements, so that the transmission system using the CMI (II) code can be easily utilized and the error-monitoring performance thereof can be improved.

In order to accomplish this object, the present invention provides a NRZ/CMI (II) code converter comprising: retiming means for retiming a series of NRZ data bits received thereto with a clock synchronized therewith: space bits-generating and delaying means connected to one of outputs of said retiming means to compose space bits of a series of said received NRZ data bits and a transmitted clock and to delay the generation of an output thereof by a delay time of an alternative mark bits-generating means; said alternative mark bits-generating means connected to another output of the retiming means to compose mark bits of a series of the NRZ data bits with clock pulses and to generate two-divided alternative mark bits; and CMI (II) code-generating means connected to an output of the space bits-generating and delaying means and an output of the alternative mark bits-generating means to convert a NRZ data received therefrom into a CMI (II) code, so that said mark bits and said space bits of a series of the NRZ data bits can be independently processed for the same time, in order to generate the CMI (II) code.

BRIEF DESCRIPTION OF THE DRAWINGS

In order that the invention may be more fully understood, reference will now be made by way of example to the accompanying drawings, in which:

FIG. 1 is a block diagram of a code converter in accordance with the present invention;

FIG. 2 is a circuit diagram of a code converter in accordance with an embodiment of the present invention.

DETAILED DESCRIPTION OF THE PREFERRED EMBODIMENTS

Figure 3A:
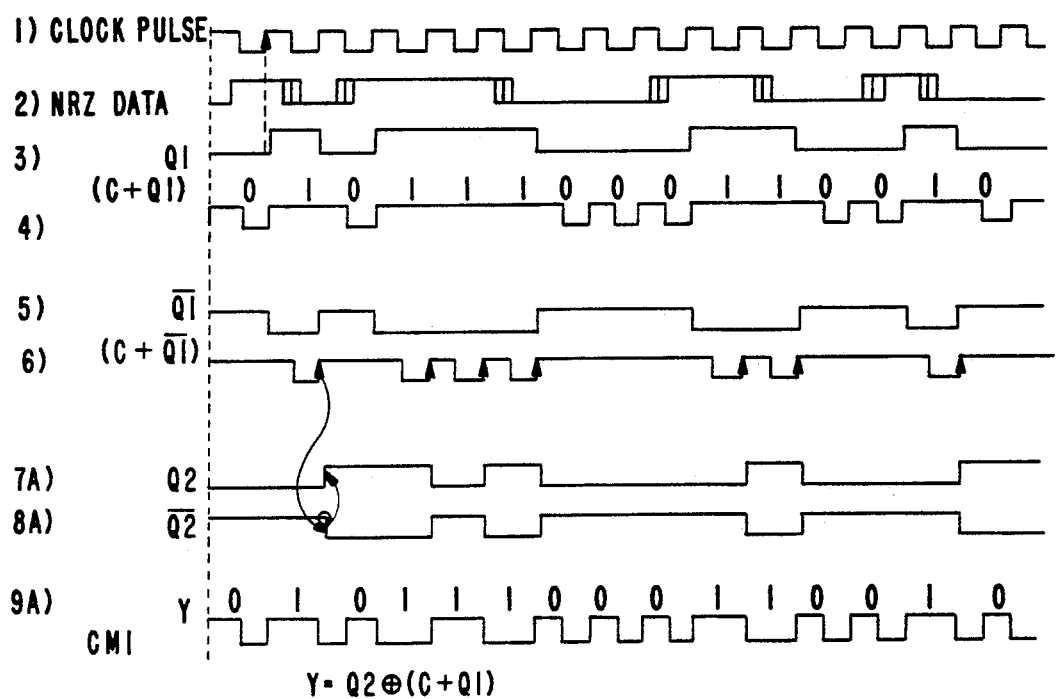
FIGS. 3A and 3B are timing diagrams of respective parts of the circuit shown in FIG. 2.

FIG. 1 shows a block diagram of a code converter in accordance with the present invention. Referring to the drawing, the code converter comprises a retiming part 1 for retiming the received NRZ data, a space bit pulse-generating and delaying part 2 connected to one of outputs of said retiming part 1, an alternative mark bit-generating part 3 connected to another output of the retiming part 1, and a CMI (II) code-generating part 4 connected to the output of said alternative mark bit-generating part 3 and the output of the space bit-generating and delaying part 2 to output NRZ (II) code pulses.

FIG. 2 is a circuit diagram of a code converter in accordance with an embodiment of the present invention, which shows a circuit for encoding a series of NRZ data bits into CMI code by using and ECL (emitter-coupled logic) gate. In the drawing, reference numerals U1 and U2 denote D-type flip-flops, U3 and U4 OR-gates, U5 an exclusive OR-gate, and U6 a time delay element. The retiming part 1 includes the D-type flip-flop U1 having an data input D1 receiving NRZ data. The D-type flip-flop U1 also has a clock pulse input CP1 receiving clock pulses synchronized with a series of NRZ data bits and carries out the retiming of the received NRZ data.

The space bit-generating and delaying part 2 includes the OR-gate U3 connnected to the output Q1 of the retiming part 1, and a delay element U6 connected to the output of said OR-gate U3. The space bit-generating part 2 receives the retimed NRZ data pulses and clock pulses as input signals, and composes the clock pulse with the NRZ data pulses only in the space bit portions of the NRZ data pulses at the OR-gate U3. The composed pulses passes through the delay element U6, the output of which is fed to the CMI code pulses-generating part 4.

The alternative mark bits-generating part 3 includes the OR-gate U4 connected to a negative output Q1 of D-type flip-flop U1 of the retiming part 1, and the D-type flip-flop U2 having a clock input connected to the output of said OR-gate U4 and a negative output Q2 connected, in a feed-back fashion, to a data input D2 of said D-type flip-flop U2. The negative output Q1 of the D-type flip-flop U1 of the retiming part 1 and the clock pulses are logically added together, directly through the OR-gate U4. Then, the output of the OR-gate U4 is applied to the clock pulse input CP2 of the D-type flip-flop U2. The D-type flip-flop U2 supplies an alternative mark bits-form signal from the positive output Q2 thereof.

The CMI (II) code-generating part 4 includes the exclusive OR-gate U5 connected to the delay element U6 and the output Q2 of the D-type flip-flop U2. The exclusive OR-gate U5 exclusively and logically adds the alternative mark bits and a series of bits obtained after delaying the composed pulses of the space bits and the clock pulses by a delay time of the D-type flip-flop U2.

Now, the operation of the code converter according to the present invention will be described. When a series of the NRZ data bits which are synchronized with the clock pulses having a frequency identical to the transmitting rate of the CMI code data bits are fed to the data input D1 of the D-type flip-flop U1, a series of the received NRZ data bits is retimed with the clock pulses in the D-type flip-flop U1, so that the relative changing rate of the delayed time of data to the clock pulses can be limited to the delay time of the D-type flip-flop U1. Thereafter, a series of the retimed NRZ data bits supplied from the output Q1 of the D-type flip-flop U1 are logically added to the clock pulses in the OR-gate U3. At this time, the clock pulses are composed only with the space bit portions of a series of the retimed NRZ data bits. The mark bit portions of a series of the retimed NRZ data bits maintains continuously in the mark state. A signal in the above-mentioned form is generated from the OR-gate U3. On the other hand, a series of the retimed NRZ data bits from the output Q1 of the D-type flip-flop U1 are logically added to the clock pulses in the OR-gate U4, in order to generate pulses under the mark state. These pulses are applied to the clock pulses input CP2 of the D-type flip-flop U2.

The output of the negative output Q2 of the D-type flip-flop U2 is fed back to the data input D2 of the D-type flip-flop U2 so that the D-type flip-flop U2 can be toggled each time when a pulse indicative of the mark state is fed to the clock input CP2 thereof. That is, the D-type flip-flop U2 outputs a signal in the form of alternative mark bits, i.e. a signal in the form of two-divided mark bits from the output Q2 thereof, each time when the mark bit of a series of the NRZ data is fed to the D-type flip-flop U2. The composed signal of the space bits and the clock pulses is supplied from the output of the OR-gate U3 to the D-type flip-flop U2, at which said signal is delayed by a delay time of the D-type flip-flop U2. At the OR-gate U5, thereafter, the delayed pulses in the form of the space bits are exclusively and logically added to a signal in the form of the alternative mark bits supplied from the output Q2 of the D-type flip-flop U2. Accordingly, mark bits are alternatively generated at the mark bit portions of a series of the NRZ data bits, and clock pulses are composed with a series of the NRZ data bits at the space bit portions of a series of the NRZ data bits. Thus, the OR-gate U5 outputs a signal of the above-mentioned form, that is, a signal formed by converting a series of the NRZ data bits.

Figure 3B:
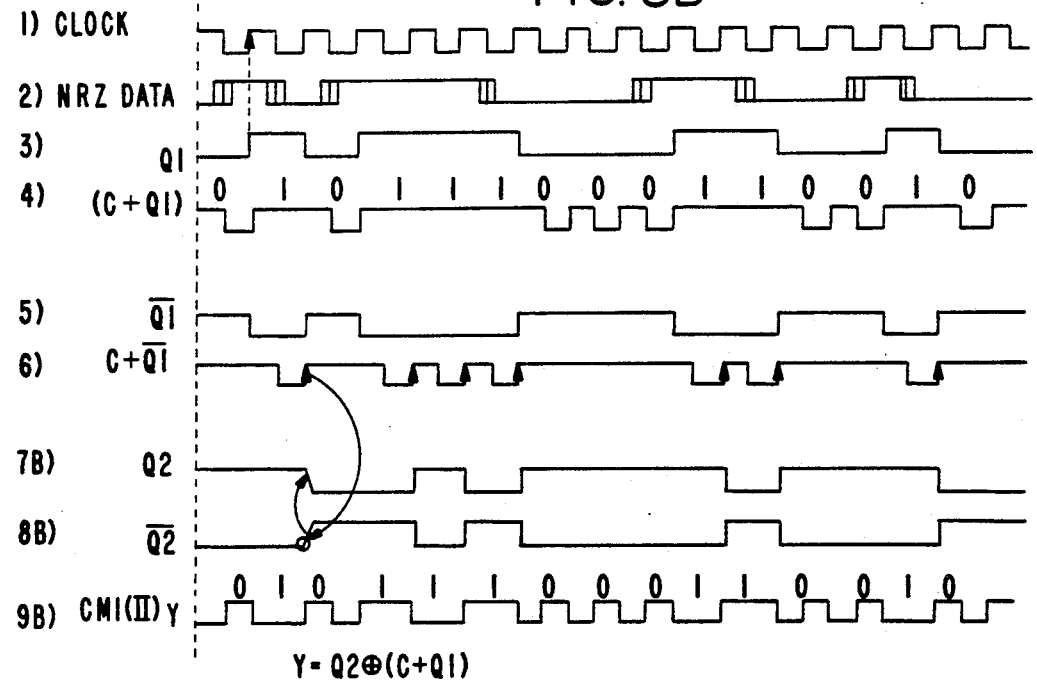

FIGS. 3A and 3B are timing diagrams of circuit parts shown in FIG. 2, respectively. The drawings show the assumed cases in which the mark bit form and the space bit form of a series of the NRZ data bits are generated continuously three times, two times, and only one time, respectively. These assumptions may show all possible cases generated during the conversion of a series of the NRZ data bits into CMI (II) code.

In the drawings, timing diagram 1 denotes clock pulses C, 2 a NRZ data, 3 an output signal from the positive output Q1 of the D-type flip-flop U1, 4 space bit pulses from the OR-gate U3, 5 an output signal from the negative output Q1 of the D-type flip-flop U1, and a 6 mark bit pulses of the OR-gate U4. Timing diagrams 7A 8A, and 9A are timing diagrams under the condition that the initial state of the D-type flip-flop U2 is "0", that is, the output from the output Q2 is "0", respectively. The timing diagram 7A indicates pulses from the positive output Q2 of the D-type flip-flop U2, jthe timing diagram 8A pulses from the negative output Q2 of the D-type flip-flop U2, and the timing diagram 9A CMI (II) pulses from the output of the exclusive OR-gate U5. Timing diagrams 7B, 8B, and 9B are timing diagrams under the condition that the initial state of the D-type flip-flop U2 is "1", that is, the output of the output Q2 is "1", respectively. The timing diagram 7B indicates pulses from the positive output Q2 of the D-type flip-flop U2, the timing diagram 8B pulses from negative output Q2 of the D-type flip-flop U2, and the timing diagram 9B CMI (II) pulses from the output of the exclusive OR-gate U5. The CMI (II) code pulses from the output of the exclusive OR-gate U5 may be expressed by the following formula:

$$Y = Q2 = (C = Q1)$$

wherein, Y is CMI (II) code pulses.

In accordance with the present invention, as described herein-before, the mark state and the space state are alternated in the mark bits of the NRZ data. On the other hand, the space bits of the NRZ data are directly composed with the clock pulses. Then, the alternative mark bits and the composed space bits are composed together, in order to generate the CMI (II) code. The mark bits and the space bits of a series of the NRZ data bits are also independently processed for the same time, in order to generate the CMI (II) code. Thus, it is possible to reduce the number of constituting logic elements and to minimize gate-delaying, thereby causing the generation of the timing glitch of pulses to be maximumly restricted. In addition, it is possible to minimumly maintain the variation of the width of code pulses (or a cycle T or one-half cycle T/2 of clock pulses). Thus, the present invention provides the following effects:

First, accomplishing the CMI (II) encoding by using simple logic elements;

Second, using the clock pulses having a frequency identical to the bit transmitting rate of the NRZ data in CMI encoding;

Third, enabling to easily integrate high-speed circuits in virtue of the use of simple logic elements; and Fourth, enabling to reduce the error rate in virtue of the reduced pulse width variation of CMI (II).

What is claimed is:

1. A NRZ to CMI (II) encoding circuit comprising:
retiming means for retiming a series of NRZ data bits received thereto with a clock synchronized therewith;
space bits-generating and delaying means connected to an output of said retiming means to compose space bits of a series of said received NRZ data bits and a NRZ data transmitting clock and to delay the generation of an output thereof by a delay time of an alternative mark bits-generating means;
said alternative mark bits-generating means connected to another output of the retiming means to compose mark bits of a series of the NRZ data bits with clock pulses and to generate two-divided alternative mark bits;
CMI (II) code-generating means connected to an output of the space bits-generating and delaying means and an output of the alternative mark bits-generating means to convert a NRZ data received therefrom into a CMI (II) code, so that said mark bits and said space bits of a series of the NRZ data bits can be independently processed at the same time, in order to generate the CMI (II) code; and wherein said space bit-generating and delaying means comprise an OR-gate connected to said one output of the retiming means, and a delay element connected to the output of said OR-gate.

2. A NRZ to CMI (II) encoding circuit comprising:
retiming means for retiming a series of NRZ data bits received thereto with a clock synchronized therewith;

space bits-generating and delaying means connected to an output of said retiming means to compose space bits of a series of said received NRZ data bits and a NRZ data transmitting clock and to delay the generation of an output thereof by a delay of time of an alternative mark bits-generating means;

said alternative mark bits-generating means connected to another output of the retiming means to compose mark bits of a series of the NRZ data bits with clock pulses and to generate two-divided alternative mark bits;

CMI (II) code-generating means connected to an output of the space bits-generating and delaying means and an output of the alternative mark bits-generating means to convert a NRZ data received therefrom into a CMI (II) code, so that said mark bits and said space bits of a series of the NRZ data bits can be independently processed at the same time, in order to generate the CMI (II) code; and wherein said alternative mark bits generating means comprise an OR-gate connected to the retiming means, and a D-type flip-flop having a data input, a clock input connected to the output of said OR-gate, and a negative output connected, in a feedback fashion, to said data input so that said D-type flip-flop can be toggled to output a signal in the form of two-divided mark bits each time when a pulse indicative of the mark state is fed to said clock input thereof.

3. NRZ to CMI (II) encoding circuit comprising:
retiming means for retiming a series of NRZ data bits received thereto with a clock synchronized therewith;

space bits-generating and delaying means connected to an output of said retiming means to compose space bits of a series of said received NRZ data bits and a NRZ data transmitting clock and to delay the generation of an output thereof by a delay time of an alternative mark bits-generating means;

said alternative mark bits-generating means connected to another output of the retiming means to compose mark bits of a series of the NRZ data bits with clock pulses and to generate two-divided alternative mark bits;

CMI (II) code-generating means connected to an output of the space bits-generating and delaying means and an output of the alternative mark bits-generating means to convert a NRZ data received therefrom into a CMI (II) code, so that said mark bits and said space bits of a series of the NRZ data bits can be independently processed for the same time, in order to generate the CMI (II) code; and wherein said CMI (II) code-generating means comprise an exclusive OR-gate in which mark bits are alternatively generated at the mark bit portions of a series of the NRZ data bits, and clock pulses are composed with a series of the NRZ data bits at the space bit portions of a series of the NRZ data bits, so that said OR-gate outputs a signal of the above-mentioned form.

* * * * *